United States Patent
Wu et al.

(10) Patent No.: US 6,885,542 B2
(45) Date of Patent: Apr. 26, 2005

(54) CAPACITOR STRUCTURE

(75) Inventors: Zhiqiang Wu, Meridian, ID (US);
Kunal Parekh, Boise, ID (US); Li Li,
Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/932,503

(22) Filed: Sep. 2, 2004

(65) Prior Publication Data

US 2005/0030697 A1 Feb. 10, 2005

Related U.S. Application Data

(62) Division of application No. 10/145,435, filed on May 14, 2002, now Pat. No. 6,787,839, which is a division of application No. 09/283,606, filed on Apr. 1, 1999, now Pat. No. 6,459,116, which is a division of application No. 08/906,213, filed on Aug. 4, 1997, now Pat. No. 6,043,119.

(51) Int. Cl.$^7$ ............................................. H01G 4/228
(52) U.S. Cl. .................... 361/306.3; 361/329; 257/306; 257/532; 438/253

(58) Field of Search .............................. 361/306.3, 303, 361/311–312, 329–330; 257/303–309; 438/254, 397, 238, 239

(56) References Cited

U.S. PATENT DOCUMENTS 6,242,777 B1 * 6/2001 Mano et al. ................. 257/347
6,459,116 B1 * 10/2002 Wu et al. .................... 257/306
6,784,519 B1 * 8/2004 Iwamoto et al. ............ 257/532

* cited by examiner

*Primary Examiner*—Anthony Dinkins
(74) *Attorney, Agent, or Firm*—Workman Nydegger

(57) ABSTRACT

A capacitor is formed with a substantially concave shape and having optional folded or convoluted surfaces. The concave shape optimizes surface area within a small volume and thereby enables the capacitor to hold a significant charge so as to assist in increased miniaturization efforts in the microelectronic field. The capacitor is fabricated in microelectronic fashion consistent with a dense DRAM array. Methods of fabrication include stack building with storage nodes that extend above a semiconductor substrate surface.

17 Claims, 6 Drawing Sheets

CAPACITOR STRUCTURE

This application is a divisional of U.S. patent application Ser. No. 10/145,435, filed on May 14, 2002, now U.S. Pat. No. 6,787,839, which is a divisional of U.S. patent application Ser. No. 09/283,606, filed on Apr. 1, 1999, now U.S. Pat. No. 6,459,116 B1, which is a divisional of U.S. patent application Ser. No. 08/906,213, filed on Aug. 4, 1997, now U.S. Pat. No. 6,043,119, which are incorporated herein by reference.

BACKGROUND OF THE INVENTION

1. The Field of the Invention

The present invention is directed to the fabrication of microelectronic storage devices. In particular the present invention is concerned with methods of making a concave shaped capacitor in a stacked capacitor memory device such as a dynamic random-access memory (DRAM) where a large ratio of surface area to capacitor volume is desired.

2. The Relevant Technology

In fabrication of microelectronic devices there exists a relentless pressure to continue miniaturization for higher device density on a single chip and to increase device speed and reliability. It is advantageous to form integrated circuits with smaller individual elements so that as many elements as possible may be formed in a single chip. In this way, electronic equipment becomes smaller and more reliable, assembly and packaging costs are minimized, and integrated circuit performance is improved.

One device that is subject to the ever-increasing pressure to miniaturize is the DRAM. DRAMs comprise arrays of memory cells that contain two basic components a field effect access transistor and a capacitor. Typically, one side of the transistor is connected to one side of the capacitor. The other side of the transistor and the transistor gate electrode are connected to external connection lines called a bit line and a word line, respectively. The other side of the capacitor is connected to a reference voltage. Therefore, the formation of the DRAM memory cell comprises the formation of a transistor, a capacitor and contacts to external circuits. The DRAM has one MOS transistor and one capacitor within a semiconductor substrate on which a plurality of spaced gates, that is, word lines, and a plurality of spaced metal wires, that is, bit lines are aligned perpendicular to each other in width-wise and lengthwise directions. Additionally, one capacitor having a contact hole in the center thereof is formed for every two gates and extends across the bit lines.

The recent trend of high integration of semiconductor devices, especially DRAM devices, has been based on the diminution of the capacitor storage cell, which leads to difficulty in providing a capacitor with sufficient capacitance to hold a charge long enough between refreshes for an optimally desired length of time.

The capacitor is usually the largest element of the integrated circuit chip. Consequently, the development of smaller DRAMs focuses to a large extent on the capacitor. Three basic types of capacitors are used in DRAMs—planar capacitors, trench capacitors, and stacked capacitors. Most large capacity DRAMs use stacked capacitors because of their greater capacitance, reliability, and ease of formation. For stacked capacitors, the side of the capacitor connected to the transistor is commonly referred to as the storage node, and the side of the capacitor connected to the reference voltage is called the cell plate. The cell plate is a layer that covers the entire top array of all the substrate-connected devices, and the storage node is compartmentalized for each respective bit storage site.

In a stacked capacitor, a conductor is usually made mainly of polysilicon, and a dielectric material is selected from a group consisting broadly of an oxide, a nitride and an oxide-nitride-oxide (ONO) laminator. In general, a capacitor occupies a large area on a semiconductor chip. Accordingly, it is one of the most important factors for high integration of DRAM devices to reduce the size of the capacitor yet to maintain the capacitance thereof.

The capacitance of a capacitor is represented by $C=(\kappa \epsilon_0 A)/T$ where C is capacitance, $\epsilon_0$ is permitivity of vacuum, $\kappa$ is the dielectric constant of the dielectric layer, A is the surface area of the capacitor, and T is the thickness of dielectric layer. The equation illustrates that the capacitance can be increased by employing dielectric materials with high dielectric constants, making the dielectric layer thin, and increasing the surface area of the capacitor.

The areas in a DRAM to which electrical connections are made are generally referred to as active areas. Active areas, which serve as source and drain regions for transistors, are discrete specially doped regions in the surface of the silicon substrate.

The ever-increasing pressure to miniaturize has placed capacitors of DRAMs under the strain of becoming ever smaller without losing the ability to hold a sufficient charge between refreshes. The challenge of making a capacitor that can hold a charge between refreshes can be approached by a larger capacitor surface area in a smaller space, or by insulating the capacitor to resist significant charge bleed-off between refreshes.

A need exists in the art for a capacitor that is contained in a small total volume that optimizes the surface area for charge storage, which capacitor is fabricated without costly and difficult extra processing steps.

SUMMARY OF THE INVENTION

In the microelectronics industry, a substrate refers to one or more semiconductor layers or structures which include active or operable portions of semiconductor devices. In the context of this document, the term "semiconductor substrate" is defined to mean any construction comprising semiconductive material, including but not limited to bulk semiconductive material such as a semiconductor wafer, either alone or in assemblies comprising other materials thereon, and semiconductive material layers, either alone or in assemblies comprising other materials. The term substrate refers to any supporting structure including but not limited to the semiconductor substrates described above.

The present invention is directed to fabrication of capacitors that have concave shapes and optional convoluted surfaces in order to optimize surface area in a confined volume. The capacitors are fabricated in microelectronic fashion in order to make dense DRAM arrays. Capacitors that hold significant charges for a given volume assist in increased miniaturization efforts in the microelectronic field where a significant charge is stored in a smaller volume.

Methods of fabrication include stack building with storage nodes that extend both above the semiconductor substrate surface in some embodiments of the inventive method, and above and below the semiconductor substrate in others. Isolation trenches are included in the manufacturing methods in order to resist charge bleed off between refreshes.

The first twelve embodiments of the present inventive method are methods of stacked capacitor formation in which a polysilicon plug between gate stacks forms part of the structure. The thirteenth through twentieth embodiments of the inventive method are methods of stacked capacitor formation with no polysilicon plug between the gate stacks.

A preferable aspect to each of the first through the twentieth embodiments of the inventive method is that each of the embodiments requires only a single masking step in the formation of the concave storage container cell into which a capacitor is formed.

These and other features of the present invention will become more fully apparent from the following description and appended claims, or may be learned by the practice of the invention as set forth hereinafter.

BRIEF DESCRIPTION OF THE DRAWINGS

In order to illustrate the manner in which the above-recited and other advantages of the invention are obtained, a more particular description of the invention briefly described above will be rendered by reference to specific embodiments thereof which are illustrated in the appended drawings. The appended drawings depict structures accomplished by methods of the present invention but the structures are depicted qualitatively and dimensions are not quantitatively restrictive. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

The present invention is directed to methods of formation of a concave shaped capacitor. The methods of the present invention are used to obtain novel capacitor structures as well.

The concave shape for a capacitor is desirable in the present invention in order to increase surface area beyond that of prior art stacked capacitors that are straight cylinders or open boxes in shape. Although the concave shape of the present invention can be a simple, virtually enclosed container, the container can also include additional surfaces, such as convoluted surfaces.

Various means for achieving desired structural and functional results are used in the practice of the instant methods and in the achieved structures. The integrated circuit DRAM device of the present invention is comprised of dual gate structures that are situated above a substrate on a semiconductor substrate. The substrate integrally has active areas that enable the gate structures to function as respective transistors. Transistor structures of this type are well known in the art in which various capacitor structures for use on an integrated circuit DRAM have first and second word lines and first and second digit lines, the integrated circuit being fabricated on the semiconductor substrate.

The methods disclosed herein and the achieved structures preferably incorporate a doped or undoped polysilicon storage node, which can be employed within a stacked capacitor. A polysilicon plug is used to contact the polysilicon storage node. A hard mask, which is preferably a nitride or oxide layer, is described below, which is preferably easily formed and sacrificed. The cell dielectric is preferably composed of oxide or nitride dielectric materials that deposit and cover thinly and evenly upon storage node materials. The cell plate is preferably made of doped polysilicon and is formed by known methods. The spacers discussed below are made from polysilicon and oxides or nitrides that can be etched selectively over materials into which the spacers are formed.

The first twelve embodiments of the present inventive method are methods of stacked capacitor formation in which a polysilicon plug between gate stacks forms part of the structure.

Figure 1:
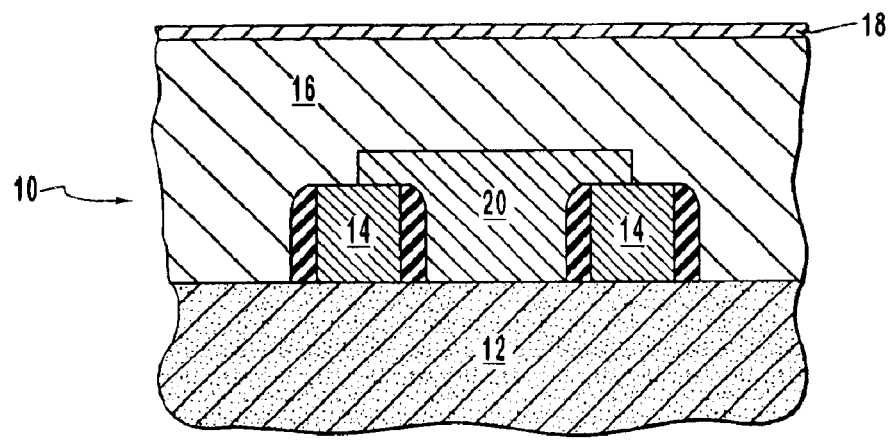
FIG. 1 shows a cross-sectional view of semiconductor device before fabrication of a concave shaped capacitor.
Figure 2:
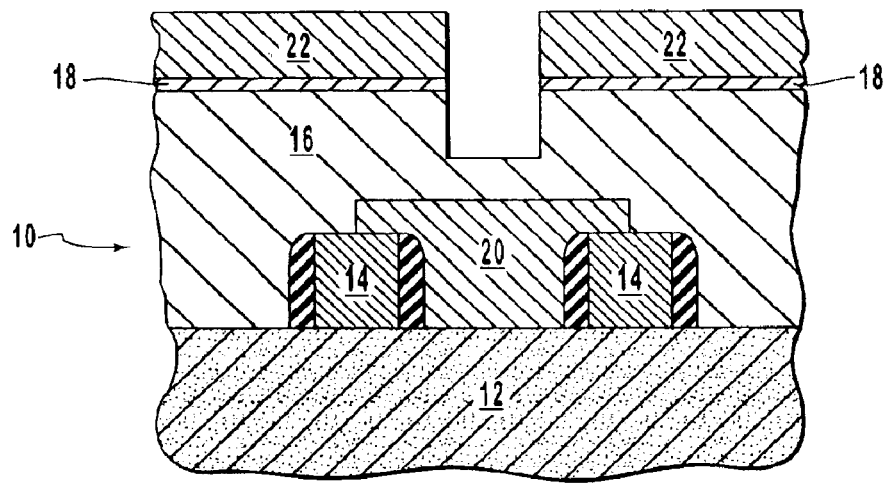
FIG. 2 shows the device of FIG. 1 after a partially-penetrating etch as a precursor hole that will become a concave storage container cell after an isotropic etch.

The first embodiment of the present invention involves a starting structure illustrated in FIG. 1. In FIG. 1, a semiconductor device 10 is being fabricated from a semiconductor substrate 12 with active areas (not shown) and two gate stacks 14 to form portions of a transistor. A polysilicon plug 20 is formed between gate stacks 14. An oxide layer 16, preferably borophospho silicate glass (BPSG), is formed over gate stacks 14 and polysilicon plug 20. A hard mask layer 18, preferably made of undoped or doped polysilicon or of a nitride composition, is formed over oxide layer 16. To this structure a photomask 22 is spun on, aligned, exposed and patterned, as illustrated in FIG. 2. Patterning and etching of hard mask 18 and a partially-penetrating etch into oxide layer 16 can be accomplished simultaneously or in a series of etching steps to result in the structure illustrated in FIG. 2.

Figure 3:
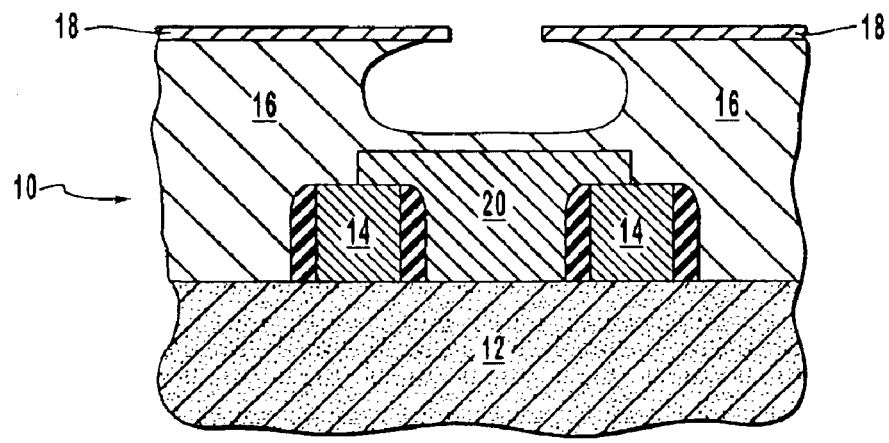
FIG. 3 shows the device of FIG. 2 where there is depicted a space that has been etched out of the oxide layer after an isotropic etch to form the concave storage container cell.

Following the partially-penetrating dry etch into oxide layer 16 illustrated in FIG. 2, an isotropic etch, preferably wet, is conducted in which hard mask 18 is undercut, as illustrated in FIG. 3. The isotropic etch creates the concave storage container cell. Undercutting creates a greater surface area to be layered over by a plate of the capacitor structure that forms on the undercut-exposed surface of hard mask 18.

If the isotropic etch does not remove oxide layer 16 down to the upper surface of polysilicon plug 20, as illustrated in FIG. 3, an optional etch that is preferably anisotropic is needed to expose polysilicon plug 20. This optional etch can be accomplished while leaving photomask 22 in place or it can be accomplished by using hard mask 18 as the masking medium. Because either photomask 22 or hard mask 18 are in place during both the isotropic concave shape forming etch and the optional anisotropic etch to expose polysilicon plug 20, the anisotropic etch is self-aligning to photomask 22 or hard mask 18 such that the concave shape formed by the anisotropic etch will be centered in the bottom thereof.

Figure 4:
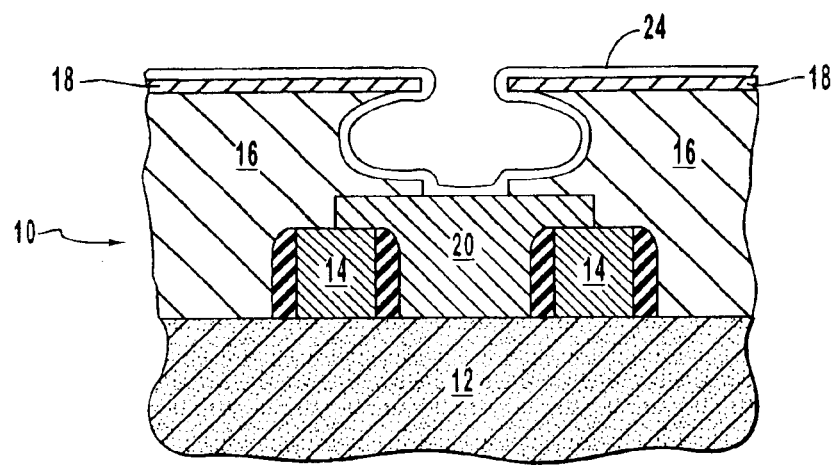
FIG. 4 shows the device of FIG. 3 and further depicts the concave storage container cell with a precursor polysilicon layer coating the cell that will become the storage node.

Following the optional anisotropic etch to expose polysilicon plug 20, storage node formation is done by chemical vapor deposition (CVD). The CVD process is a deposition of a polysilicon which is preferably doped with a doping that is similar to the doping of polysilicon plug 20. The CVD process forms a storage node precursor or a doped polysilicon storage layer 24. Doped polysilicon storage layer 24 is formed in such a way that the entire inside of the concave storage container cell is coated, and the upper surface of hard mask layer 18 is incidentally also coated, as illustrated in FIG. 4.

In a next step, all material above oxide layer 16 is to be removed. Removal of both hard mask 18 and that portion of polysilicon storage layer 24 covering hard mask layer 18 can be accomplished by one of at least three methods.

The first method of removing all material above oxide layer 16 is to optionally fill the concave storage container cell with photomasking material and to planarize such as by chemical-mechanical polishing (CMP) of the superficial portions of polysilicon storage layer 24 and all of hard mask layer 18, stopping on oxide layer 16. Filling the concave storage container cell with photomasking material prevents fine slurry particulates used in CMP from becoming lodged in the concave storage container cell. Removal of photomasking material can be done by any method known and preferred in the art. In this first method, the sacrificial portions of polysilicon storage layer 24 can be removed before the CMP by a dry etch of upper portions of polysilicon storage layer 24.

Figure 5:
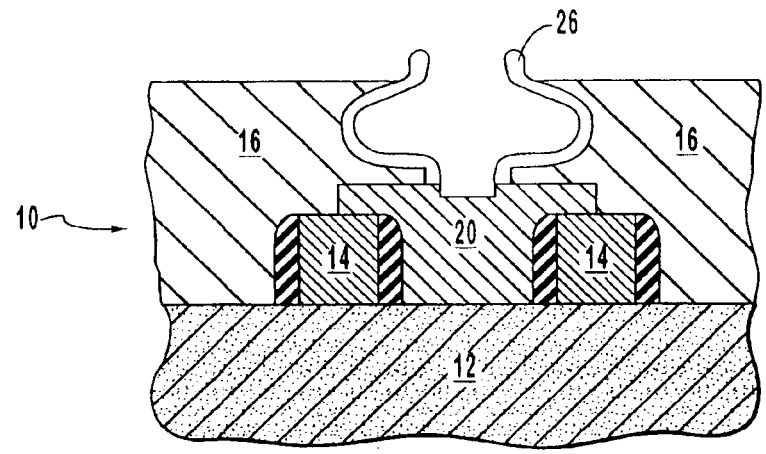
FIG. 5 shows the structure of FIG. 4 with sacrificial layers removed.

The second method of removing all material above oxide layer 16 is a dry anisotropic etch of both the superficial portions of polysilicon storage layer 24 and of hard mask layer 18. In this etch, some etching of horizontally-situated portions of polysilicon storage layer 24 within the concave storage container cell will occur, such as at the bottom of the concave storage container cell where polysilicon storage layer 24 contacts substrate 12. The anisotropic dry etch will likely etch away any horizontally-situated portions of polysilicon storage layer 24 to form what has now become storage node 26. The anisotropic dry etch can also etch into polysilicon plug 20 to create a recessed area at a top surface thereof. Such an etch will lessen the contact area between storage node 26 and polysilicon plug 20. FIG. 5 illustrates the accomplished removal of superficial polysilicon storage layer 24 and of hard mask layer 18 by use of any of the first to the third methods as set forth above and below, respectively.

The third method of removing all material above oxide layer 16 is accomplished with a wet etch that is selective to oxide layer 16 and is not selective to polysilicon storage layer 24. In this etch there will be some inevitable etching of the storage node portions of polysilicon storage layer 24 unless the concave storage container cell is likewise filled with a photomasking material such as in the CMP option described above. In such case, the wet etch will also be selective to the photomasking material within the concave storage container cell.

Figure 6:
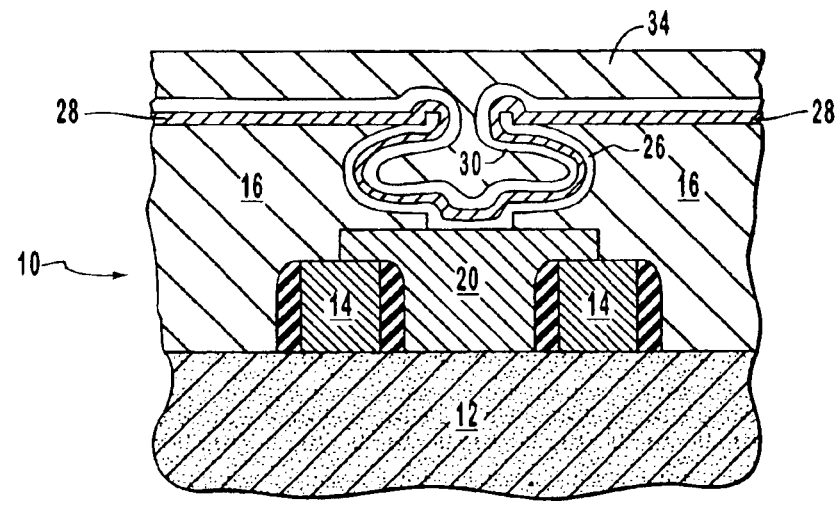
FIG. 6 shows the device of FIG. 5 with a completed stacked capacitor having concave interior walls.

To complete the capacitor, FIG. 6 illustrates formation of a cell dielectric 28 that both coats the exposed surface of storage node 26 and the upper surface of oxide layer 16 where hard mask layer 18 formerly was situated. Cell dielectric 28 is deposited preferably by CVD. Finally, a cell plate polysilicon layer 30 is formed over cell dielectric 28, and a superficial insulating layer 34 is formed over the entire structure and optionally CMP processed.

Figure 7:
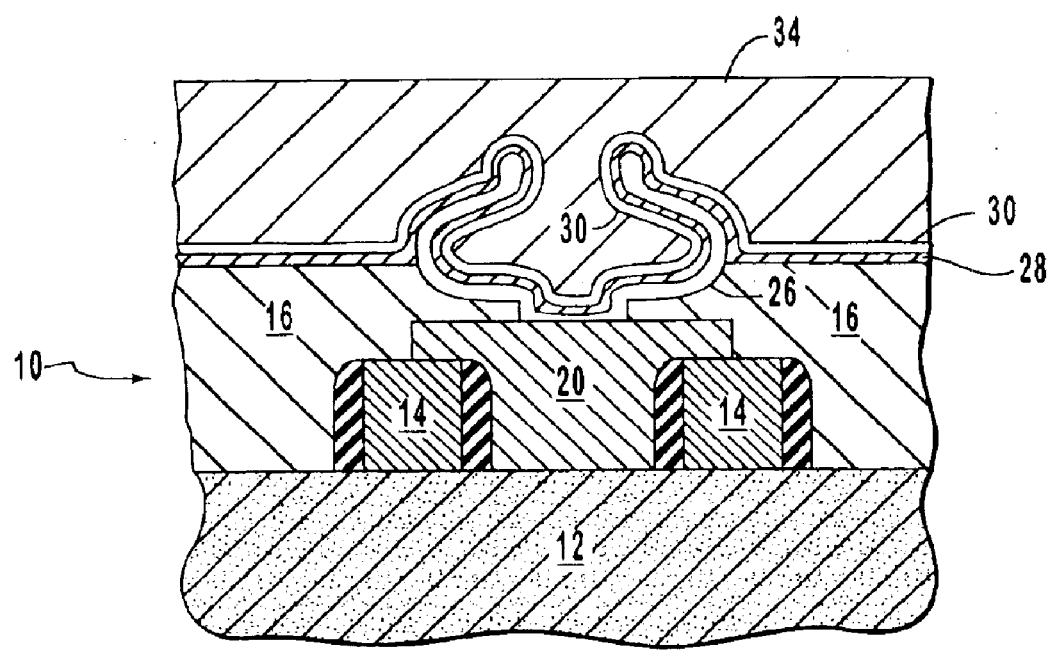
FIG. 7 shows an alternative completed capacitor in which the cell polysilicon has a larger surface area wrapped around the storage node than that which is shown in FIG. 6.

The second embodiment of the present inventive method, aspects of which are seen in FIG. 7, is accomplished with an additional process step in the first embodiment in which, following removal of superficial portions of polysilicon storage layer 24 and prior to formation of cell dielectric 28, external lateral surfaces of storage node 26 are exposed through an additional etch of oxide layer 16. By the additional etch to remove some of oxide layer 16, there is a larger surface area possible for cell plate polysilicon layer 30 such that a larger charge can be induced on storage node 26. The extent of exposing external lateral surfaces of storage node 26 is limited by the ability of storage node 26 to be laid bare and yet to resist physical damage during the remainder of capacitor fabrication.

After the additional etch that removes some of oxide layer 16 surrounding storage node 26, cell dielectric 28 formation, cell plate polysilicon layer 30 formation, and a superficial insulating layer 34 formation are accomplished. By way of example, in this second embodiment seen in FIG. 7, the means for inducing a charge is in contact with the means for insulating, and the means for insulating contacts at least two surfaces of the means for charge storing in regions above the gate structure.

Third and fourth embodiments of the present inventive method incorporate an additional process step to that of the first and second embodiments of the inventive method. In the third and fourth embodiments of the inventive method, a partial etch into oxide layer 16 is followed by formation of spacers 32, illustrated in FIG. 8.

Although it is desirable to maximize the depth of spacers 32 in order to increase the storage node surface area that will be formed on both sides of spacers 32, spacer depth is dictated by the eventual "bread loafing" of the opening to the concave storage container cell during all required deposition operations in which deposition materials must pass through the opening. Some materials will inevitably deposit so as to narrow the opening, while others will pass through and deposit on the inner walls of the concave storage container cell. With increased depth of the longitudinally vertical extension of the spacers, an exacerbation of the bread loafing effect may take place between the spacers of node, dielectric, or plate materials in the opening to the concave storage container cell before the capacitor structure is completed.

Figure 9:
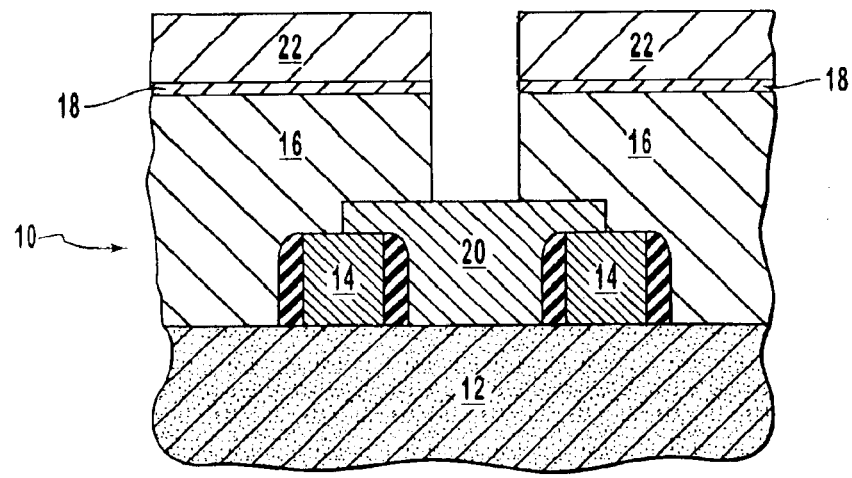
FIG. 9 shows a cross-sectional view of a semiconductor device before fabrication of a concave shaped capacitor, wherein a single etch has etched through a photomask layer, hard mask, an oxide layer, and onto a polysilicon plug between two gate stacks.

Following spacer formation, an isotropic etch is carried out for the third embodiment of the inventive method to open up the concave storage container cell. For the fourth embodiment, as seen in FIG. 9, an alternative step of an anisotropic etch penetrates oxide layer 16 down to the upper surface of polysilicon plug 20. This is followed by an isotropic etch in oxide layer 16 to etch out the concave storage container cell.

Figure 10:
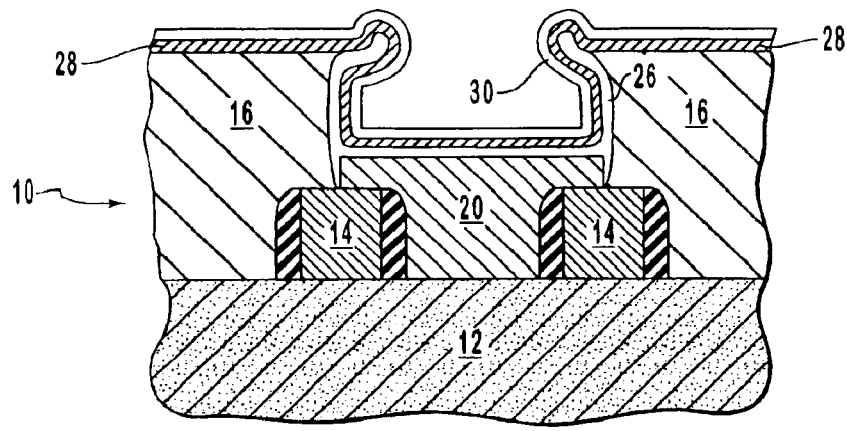
FIG. 10 shows the device of FIG. 9 further processed to incorporate a completed capacitor, wherein the storage node contacts the polysilicon plug across the upper surface thereof.
Figure 11:
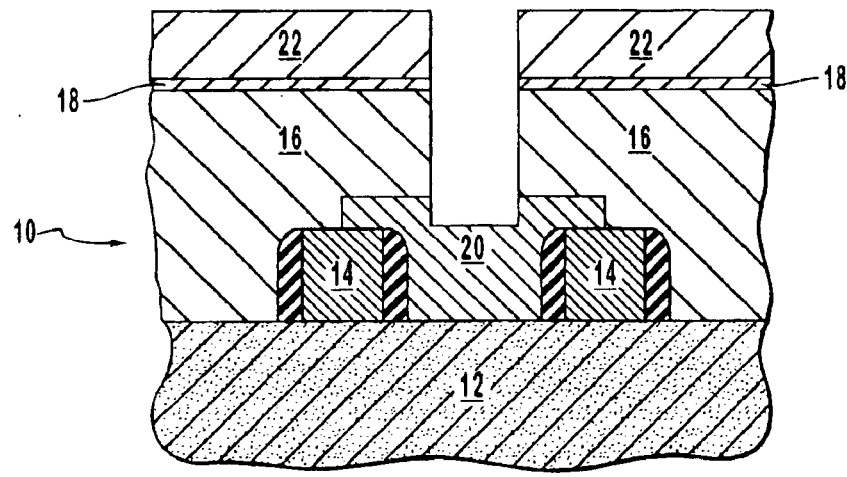
FIG. 11 shows a cross-sectional view of a semiconductor device before fabrication of a concave shaped capacitor, wherein a single etch has etched through a photomask layer, hard mask, an oxide layer, and partially into a polysilicon plug between two gate stacks.
Figure 12:
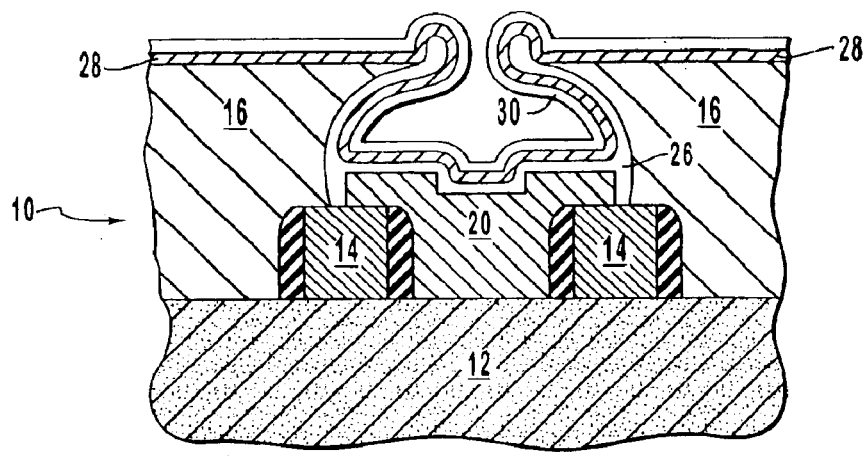
FIG. 12 shows the device of FIG. 11 after a completed capacitor has been formed between and above the dual gate stack and on the polysilicon plug having a recess in a top surface thereof

The fifth, sixth, seventh, and eighth embodiments of the present inventive method are illustrated in part within FIGS. 9 and 10. In the fifth embodiment, an anisotropic dry etch etches through oxide layer 16 to extend downwardly to the top surface of polysilicon plug 20, as seen in FIG. 9. In this fifth embodiment, there is a finished storage node-polysilicon plug contact interface wherein polysilicon plug 20 contacts the storage node across an entire upper surface of polysilicon plug 20, as illustrated in FIG. 10. In the sixth embodiment, an anisotropic etch etches through oxide layer 16 and partially into polysilicon plug 20, as seen in FIG. 11. In both fifth and sixth embodiments of the inventive method, an isotropic etch follows to open the concave storage container cell. In the fifth and sixth embodiments of the inventive method, there is a finished storage node-polysilicon plug contact interface wherein polysilicon plug 20 contacts the storage node across an entire upper surface of polysilicon plug 20. The interface may include a recessed area at a top surface of the polysilicon plug as illustrated in FIG. 12.

Formation of doped polysilicon storage layer 24 followed by any of the three above-disclosed methods of removing sacrificial portions of polysilicon layer 24 and hard mask layer 18 is next accomplished. The structure achieved by the sixth embodiment is illustrated in FIG. 12.

Seventh and eighth embodiments of the inventive method are variations of the fifth and sixth embodiments of the inventive method, respectively, that include the optional removal etch of some of oxide layer 16 that exposes external lateral surfaces of storage node 26 in order to increase the cell plate polysilicon surface area similar to that illustrated in FIG. 7.

Figure 8:
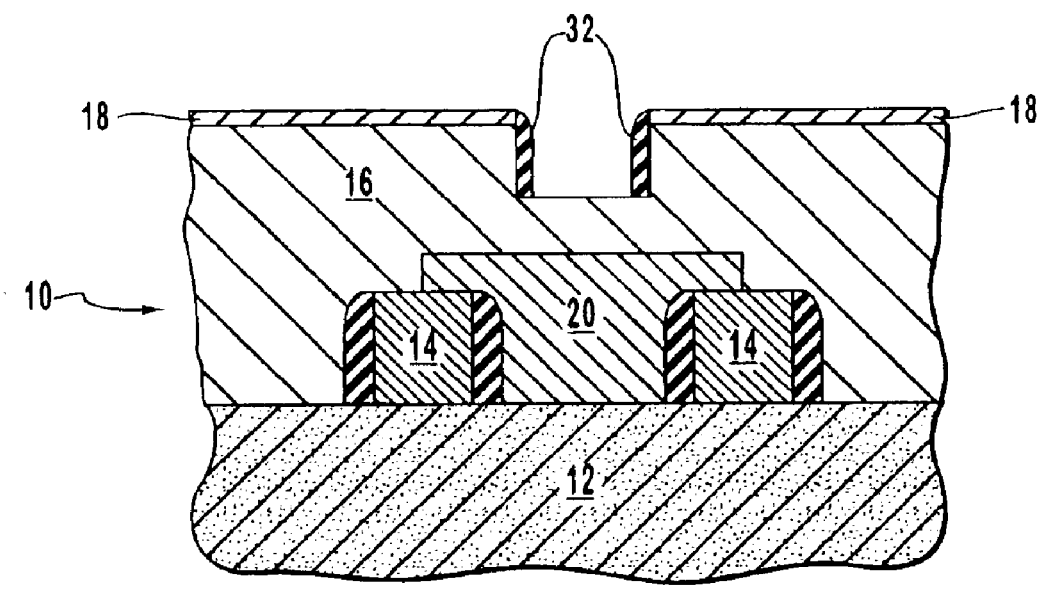
FIG. 8 shows a cross-sectional view of a semiconductor device before fabrication of a concave shaped capacitor in which spacers are formed in order to create a convoluted capacitor surface.
Figure 13:
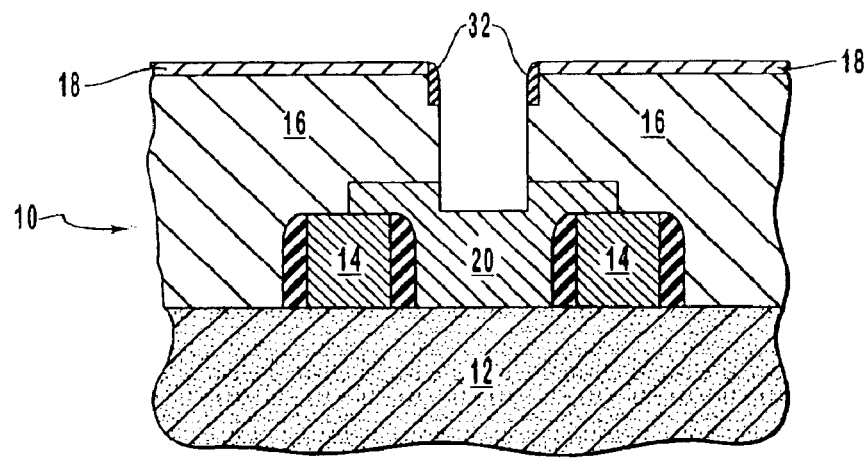
FIG. 13 shows a cross-sectional view of a semiconductor device before fabrication of a concave shaped capacitor, wherein a single etch has etched through a hard mask, an oxide layer, and partially into a polysilicon plug between two gate stacks, wherein the etch is a mid-process anisotropic etch followed by a spacer formation at an opening to volume created by the single etch, the opening being for the placement for an eventual convoluted capacitor surface.
Figure 14:
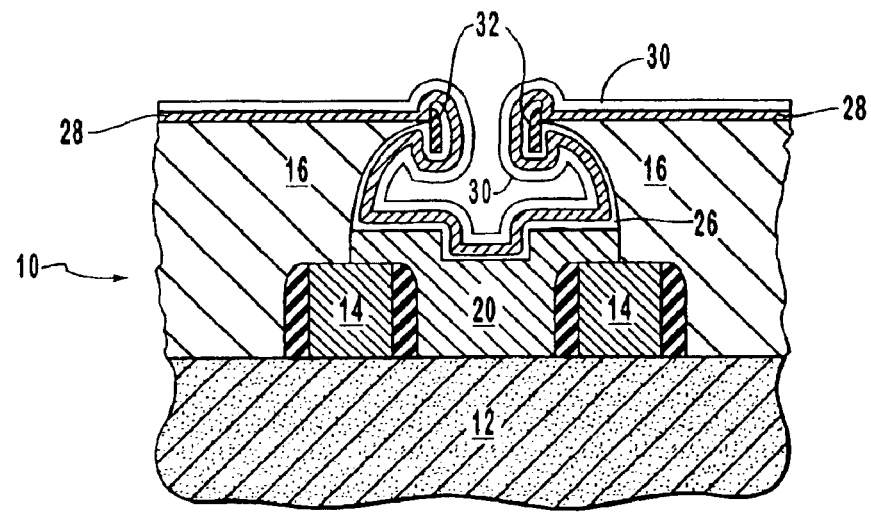
FIG. 14 shows the device of FIG. 13 having a completed capacitor structure in which both a storage node and a cell plate polysilicon have convoluted surfaces.

The ninth and tenth embodiments of the present inventive method, illustrated in part in FIG. 8 for the ninth embodiment and FIGS. 8, 13, and 14 for the tenth embodiment, include a partially-penetrating anisotropic etch of oxide layer 16 followed by spacer 32 formation. Once again, if the isotropic etch that follows formation of spacer 32 is insufficient to contact polysilicon plug 20, an additional etch that is anisotropic is carried out to place a contact corridor in the bottom of the concave storage container cell, so as to open up and expose a surface on polysilicon plug 20.

The tenth embodiment, seen in FIGS. 8, 13, and 14, includes a partially-penetrating anisotropic etch of oxide layer 16 followed by formation of spacer 32, the same as in the ninth embodiment, but then a subsequent anisotropic etch penetrates through the remaining portions of oxide layer 16 to expose a surface on polysilicon plug 20, and then partially etches into polysilicon plug 20. There follows an isotropic etch to create the concave storage container cell, the upper surfaces removal by any of the three disclosed methods set forth above, and the formation of cell dielectric 28 and cell plate polysilicon 30 to accomplish the structure illustrated in FIG. 14.

The eleventh and twelfth embodiments of the present inventive method are variations of the ninth and tenth embodiments of the inventive method that include the optional removal etch of some of oxide layer 16 that exposes external lateral surfaces of storage node 26 in order to increase the cell plate polysilicon surface area similar to that illustrated in FIG. 7.

The thirteenth through twentieth embodiments of the inventive method are methods of stacked capacitor formation where polysilicon plug 20 between gate stacks 14 has been omitted.

Figure 15:
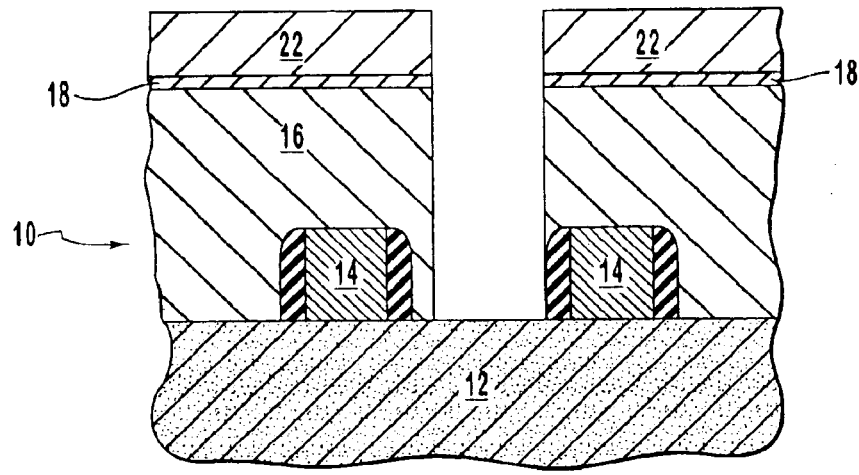
FIG. 15 shows a cross-sectional view of a semiconductor device before fabrication of a concave shaped capacitor, wherein a single etch has etched through a photomask layer, a hard mask, and an oxide layer to expose an opening on a surface of a substrate of a semiconductor wafer between two gate stacks, wherein the single etch, unlike that process illustrated in FIG. 9, has no polysilicon plug between the two gate stacks.

FIG. 15 illustrates a thirteenth embodiment of the present inventive method in which a semiconductor device 10 is being fabricated, from a structure similar to that illustrated in FIG. 1, but without a polysilicon plug 20. Substrate 12 with active areas (not shown) and two gate stacks 14 form portions of a transistor. Oxide layer 16 is formed over gate stacks 14 and hard mask layer 18 composed of polysilicon, is formed over oxide layer 16. Photomask 22 is spun on, aligned, exposed and patterned, as was illustrated analogously in FIG. 2. An anisotropic etch that is selective to photomask 22 is accomplished through hard mask layer 18 and oxide layer 16 so as to etch down to an opening that exposes a surface on substrate 12. Gate stacks 14 act to align the anisotropic etch, if the anisotropic etch is selective to spacers forming the periphery of gate stacks 14. An isotropic etch of oxide layer 16 that is selective to hard mask layer 18 and gate stacks 14 significantly undercuts hard mask layer 18 so as to create a concave storage container cell.

Figure 16:
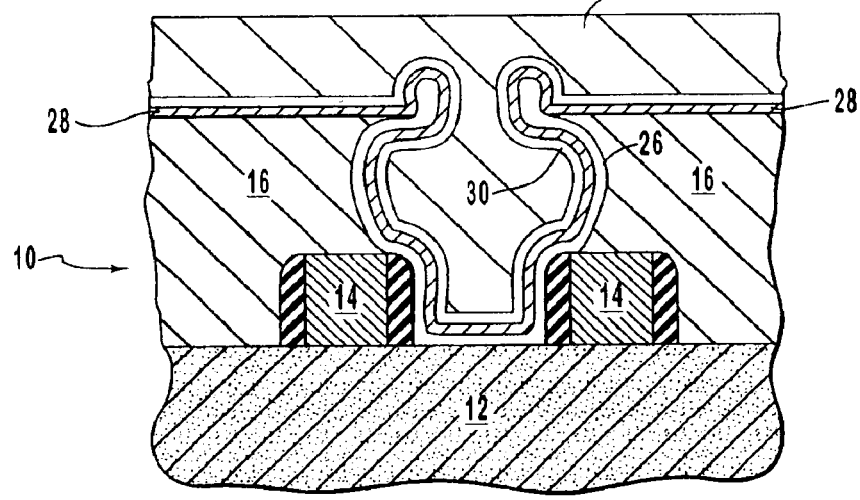
FIG. 16 shows a cross-sectional view of a completed capacitor made from a process option depicted in FIG. 15.

A formation of polysilicon storage layer 24 follows which deposits within the concave storage container cell and upon hard mask layer 18. The next step is removing of all superficial portions of polysilicon storage layer 24 above hard mask layer 18. This removing step can be accomplished by any of three methods as disclosed above. To complete the capacitor of the thirteenth embodiment, as seen in FIG. 16, a cell dielectric 28 is formed over storage node 26 and a cell plate polysilicon layer 30 is formed over cell dielectric 28. The device is finished with formation of superficial insulating layer 34 which may at least partially fill the concave storage container cell so as to be in contact with cell plate polysilicon layer 30.

Figure 17:
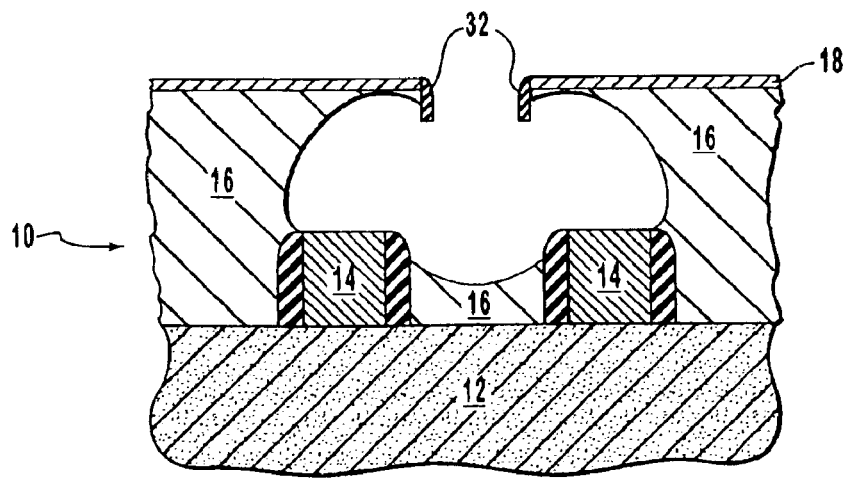
FIG. 17 shows a cross-sectional view of semiconductor device before fabrication of a concave shaped capacitor, wherein a single etch has etched through a hard mask and has partially etched into an oxide layer to a depth extending between two gate stacks but above a surface of a substrate of a semiconductor wafer therebetween, wherein an incomplete isotropic etch with spacers extending vertically towards the substrate from the hard mask, the device requiring an additional step of removing the oxide layer between the gate stacks prior to formation of the intended capacitor structure.

Regarding the thirteenth embodiment, because of the uniformity of an isotropic etch, and a large relative depth of the isotropic etch down to substrate 12, it may occur that a small portion of oxide layer 16 will lie unremoved at the area between gate stacks 14 as illustrated in FIG. 17. Unremoved oxide layer 16 between gate stacks 14 is removed before forming polysilicon storage layer 24 in order to complete an electrical connection with substrate 12.

Removal of that portion of oxide layer 16 lying between gate stacks 14 can be accomplished by an anisotropic etch prior to the isotropic etch of the concave storage container cell, where the anisotropic etch penetrates substantially all the way down to substrate 12. In this way, a substantially uniform isotropic etch occurs in oxide layer 16. Additionally, with an isotropic etch that is selective to both gate stacks 14 and substrate 12, substantially vertical walls are formed above substrate 12 between gate stacks 14 within the concave storage container cell. Removal of that portion of oxide layer 16 between gate stacks 14 can also be done by an anisotropic etch after the isotropic etch. This option simply removes that portion of oxide layer 16 that remains between gate stacks 14.

A process engineer may choose to remove a portion of oxide layer 16, illustrated analogously in FIG. 7, in order to expose external lateral surfaces of storage node 26 that would further increase the surface area between storage node 26 and cell plate polysilicon 30, similar to the exposed external lateral portions of storage polysilicon for creation of a fourteenth embodiment.

The fifteenth and sixteenth embodiments of the inventive method are accomplished as optional steps to the thirteenth and fourteenth embodiments of the present inventive method by the step of forming a spacer immediately below the level of hard mask layer 18 that will increase the surface area of the capacitor. A spacer is formed into a concave storage container cell precursor that is followed by an isotropic etch for the fifteenth embodiment, or that is followed by an anisotropic etch to the substrate and an isotropic etch for the sixteenth embodiment. For both embodiments, the isotropic etch opens the concave storage container cell. The fifteenth and sixteenth embodiments of the present inventive method are combinations of the ninth with the thirteenth, and the tenth with the fourteenth embodiments of the inventive method, respectively, in which spacers are formed to increase the surface area of the subsequently formed polysilicon storage layer 24. The fifteenth and sixteenth embodiments of the inventive method are illustrated by way of analogy in FIG. 8 in which the process is started, and in FIG. 13 in which the penetrating etch down to substrate 12 is accomplished, with the exception that there is no polysilicon plug 20 in the structure realized by the fifteenth and sixteenth embodiments of the inventive method.

In seventeenth, eighteenth, nineteenth, and twentieth embodiments of the present inventive method, described below, a further increase in storage capacity is accomplished in a starting structure in which polysilicon plug 20 is likewise not present. Spacers 32 are formed as in the third embodiment.

In the seventeenth embodiment, an isotropic etch follows formation of spacer 32 as illustrated in FIG. 17. Following a partially-penetrating dry etch into oxide layer 16, spacers 32 are formed and an isotropic wet etch is conducted in which hard mask 18 and spacers 32 are undercut, as illustrated in FIG. 17. The isotropic etch clears out a concave shape to form the concave storage container cell. Undercutting creates a greater surface area for formation of a polysilicon storage layer 24 that forms on the undercut-exposed surface of hard mask 18.

If the isotropic etch does not remove oxide layer 16 between gate stacks 14, down to the upper surface of substrate 12, as illustrated in FIG. 17, an optional etch that is preferably anisotropic is needed to expose substrate 12. This optional etch can be accomplished while leaving photomask 22, as seen in FIG. 9, in place or it can be accomplished by using hard mask 18 as the masking medium. Because either photomask 22 or hard mask 18 are in place during both the isotropic concave shape forming etch and the optional anisotropic etch to expose a surface upon substrate 12, the anisotropic etch is self-aligning to photomask 22 or hard mask 18 such that the hole formed by the anisotropic etch will be centered in the bottom of the concave storage container cell.

Following the optional anisotropic etch to expose substrate 12; a doped polysilicon storage layer 24 is formed in such a way that the inside of the concave storage container cell is coated, and the upper surface of hard mask layer 18 is incidentally also coated. Removal of both hard mask 18 and that portion of polysilicon storage layer 24 covering hard mask layer 18 can be accomplished by one of the three methods disclosed above.

The eighteenth embodiment includes a single penetrating anisotropic etch of oxide layer 16 that contacts substrate 12 after formation of spacers 32. There follows an isotropic etch that opens up the concave storage container cell. Formation of polysilicon storage layer 24 and removal of sacrificial portions thereof along with hard mask layer 18 is followed by formations of cell dielectric 28 and cell plate polysilicon 30.

The nineteenth and twentieth embodiments of the inventive method reflect the optional external surface area exposure of storage node 26 in the seventeenth and eighteenth embodiments of the inventive method by etching some of oxide layer 16 to lower its topographical profile as illustrated analogously in the exposed external lateral surfaces of storage node 26 in FIG. 7.

The present invention may be embodied in other specific forms without departing from its spirit or essential characteristics. The described embodiments are to be considered in all respects only as illustrative and not restrictive. The scope of the invention is, therefore, indicated by the appended claims and their combination in whole or in part rather than by the foregoing description. All changes that come within the meaning and range of equivalency of the claims are to be embraced within their scope.

What is claimed is:

1. A capacitor structure comprising:

two gate stacks situated upon a semiconductor substrate;

a storage node layer;

a cell dielectric layer situated on the storage node layer;

a cell plate layer situated on the cell dielectric layer, wherein each of the storage node layer, cell dielectric layer, and cell plate layer have a substantially concave shape and are situated above the two gate stacks;

a concave shaped storage container cell region having an opening thereto and being defined by a concave surface of the storage node layer; and an insulation layer situated upon the cell plate layer and within the concave shaped storage container cell region, wherein the insulation layer makes contact with the cell plate layer outside of the concave shaped storage container cell region and extends both below and above the storage node layer, the cell dielectric layer, and the cell plate layer;

wherein the cell dielectric layer makes a conforming contact with the storage node layer, and the cell plate layer makes a conforming contact with the cell dielectric layer.

2. The capacitor structure of claim 1, wherein the storage node layer and the cell plate layer comprise polysilicon.

3. The capacitor structure of claim 2, wherein the polysilicon of the storage node layer is doped.

4. A capacitor structure comprising:
two gate stacks situated upon a semiconductor substrate;
a storage node layer;
a cell dielectric layer situated on the storage node layer;
a cell plate layer situated on the cell dielectric layer, wherein each of the storage node layer, cell dielectric layer, and cell plate layer have a substantially concave shape and are situated above the two gate stacks;
a concave shaped storage container cell region having an opening thereto and being defined by a concave surface of the storage node layer;
an insulation layer situated upon the cell plate layer and within the concave shaped storage container cell region, wherein the insulation layer makes contact with the cell plate layer outside of the concave shaped storage container cell region and extends both below and above the storage node layer, the cell dielectric layer, and the cell plate layer; and
a contact plug situated between and in contact with the two gate stacks, and extending at least partially above both the gate stacks and the semiconductor substrate, wherein the contact plug has a top surface in contact with the storage node layer;
wherein the cell dielectric layer makes a conforming contact with the storage node layer, and the cell plate layer makes a conforming contact with the cell dielectric layer.

5. The capacitor structure of claim 4, wherein the contact plug, the storage node layer, and the cell plate layer comprise polysilicon.

6. The capacitor structure of claim 5, wherein the polysilicon of the storage node layer is doped.

7. A capacitor structure on a semiconductor substrate, comprising:
a storage node layer;
a cell dielectric layer situated on the storage node layer;
a cell plate layer situated on the cell dielectric layer, wherein each of the storage node layer, cell dielectric layer, and cell plate layer have a substantially concave shape and are at least partially above a semiconductor substrate;
a concave shaped storage container cell region having an opening thereto and being defined by a concave surface of the storage node layer; and
an insulation layer situated upon the cell plate layer and within the concave shaped storage container cell region, wherein the insulation layer makes contact with the cell plate layer outside of the concave shaped storage container cell region and extends both below and above the storage node layer, the cell dielectric layer, and the cell plate layer;
wherein the cell dielectric layer makes a conforming contact with the storage node layer, and the cell plate layer makes a conforming contact with the cell dielectric layer.

8. A capacitor structure on a semiconductor substrate, comprising:
a storage node layer;
a cell dielectric layer situated on the storage node layer;
a cell plate layer situated on the cell dielectric layer, wherein each of the storage node layer, cell dielectric layer, and cell plate layer having a substantially concave shape and are at least partially above a semiconductor substrate;
a concave shaped storage container cell region having an opening thereto and being defined by a concave surface of the storage node layer;
an insulation layer situated upon the cell plate layer and within the concave shaped storage container cell region, wherein the insulation layer makes contact with the cell plate layer outside of the concave shaped storage container cell region and extends both below and above the storage node layer, the cell dielectric layer, and the cell plate layer; and
a contact plug extending above the semiconductor substrate and having a top surface in contact with the storage node layer;
wherein the cell dielectric layer makes a conforming contact with the storage node layer, and the cell plate layer makes a conforming contact with the cell dielectric layer.

9. A capacitor structure comprising:
a semiconductor substrate having a substantially planar top surface;
a pair of gate stacks upon the semiconductor substrate;
a dielectric material upon the semiconductor substrate having a recess formed therein, wherein:
the recess extends between the pair of gate stacks, has an opening thereto, and is defined by an interior surface;
the opening to the recess has a width; and
the recess has a maximum width that is greater than the width of the opening to the recess;
a storage node layer upon the interior surface;
a cell dielectric layer upon the storage node layer;
a cell plate layer upon the cell dielectric layer; and
an insulation layer situated upon the cell plate layer and within the recess.

10. The capacitor structure of claim 9, wherein the storage node layer is upon the semiconductor substrate.

11. The capacitor structure of claim 9, wherein each of the storage node layer, cell dielectric layer, and cell plate layer have portions that are situated between the two gate stacks.

12. The capacitor structure of claim 9, wherein each of the storage node layer, the cell dielectric layer, and the cell plate layer has a surface within the recess that is both concave and convex.

13. A capacitor structure including a substrate having a dielectric material thereon, a storage node layer situated over the substrate, a cell dielectric layer upon the storage node layer, and a cell plate layer upon the cell dielectric layer, the capacitor structure comprising:
a recess formed within the dielectric material and having therein the storage node layer, the cell dielectric layer, and the cell plate layer, wherein:
the recess is most narrow at an opening thereto;
the substrate comprises a semiconductive material; and
the storage node layer is upon the substrate.

14. The capacitor structure of claim 13, further comprising a pair of gate stacks upon the substrate, wherein the recess and each of the storage node layer, the cell dielectric layer, and the cell plate layer extends between the pair of gate stacks.

15. The capacitor structure of claim 13, further comprising an electrical insulation layer that extends continuously into and out of the recess through the opening to the recess.

16. A capacitor structure including a substrate having a dielectric material thereover, a storage node layer situated above the substrate, a cell dielectric layer upon the storage node layer, and a cell plate layer upon the cell dielectric layer, the capacitor structure comprising:

a pair of gate stacks upon the substrate;

an opening in a surface of the dielectric material expanding to a wider recess within and defined by the dielectric material such that the storage node layer, the cell dielectric layer, and the cell plate layer are within the recess; and an electrical insulator extending into and out of the opening to the recess;

wherein the recess and each of the storage node layer, the cell dielectric layer, and the cell plate layer extends between the pair of gate stacks.

17. The capacitor structure of claim 16, further comprising a contact plug upon the substrate, wherein the storage node layer is upon the contact plug.

* * * * *